United States Patent
Hong et al.

(10) Patent No.: US 12,199,467 B2
(45) Date of Patent: Jan. 14, 2025

(54) SWITCHING MODULE

(71) Applicant: Delta Electronics (Shanghai) Co., Ltd., Shanghai (CN)

(72) Inventors: Shouyu Hong, Shanghai (CN); Yiqing Ye, Shanghai (CN); Haibin Xu, Shanghai (CN); Weicheng Zhou, Shanghai (CN); Tao Wang, Shanghai (CN); Min Zhou, Shanghai (CN); Yicong Xie, Shanghai (CN); Zengsheng Wang, Shanghai (CN)

(73) Assignee: Delta Electronics (Shanghai) Co., Ltd., Shanghai (CN)

( * ) Notice: Subject to any disclaimer, the term of this patent is extended or adjusted under 35 U.S.C. 154(b) by 390 days.

(21) Appl. No.: 17/677,769

(22) Filed: Feb. 22, 2022

(65) Prior Publication Data
US 2022/0294261 A1    Sep. 15, 2022

(30) Foreign Application Priority Data

Mar. 11, 2021  (CN) .......................... 202110263916.6

(51) Int. Cl.
*H02J 9/00*    (2006.01)
*H02J 9/06*    (2006.01)
*H02M 1/00*    (2006.01)

(52) U.S. Cl.
CPC .......... *H02J 9/068* (2020.01); *H02M 1/0009* (2021.05); *H02M 1/0032* (2021.05)

(58) Field of Classification Search
CPC ..... H02J 9/068; H02M 1/0009; H02M 1/0032
See application file for complete search history.

(56) References Cited

U.S. PATENT DOCUMENTS

| | | | |
|---|---|---|---|
| 2011/0169549 A1 | 7/2011 | Wu et al. | |
| 2014/0184303 A1* | 7/2014 | Hasegawa | H01L 23/49562 327/377 |
| 2015/0138239 A1 | 5/2015 | Kim et al. | |

(Continued)

FOREIGN PATENT DOCUMENTS

| | | |
|---|---|---|
| CN | 100461398 C | 2/2009 |
| CN | 107482945 A | 12/2017 |

(Continued)

*Primary Examiner* — Jue Zhang
*Assistant Examiner* — Afework S Demisse
(74) *Attorney, Agent, or Firm* — KIRTON McCONKIE; Evan R. Witt

(57) ABSTRACT

A switching module includes a substrate, a switching element, a first control part, a second control part, a first power part and a second power part. The switching element is disposed on the substrate. The switching element includes a first control terminal, a second control terminal, a first power terminal and a second power terminal. The first control part is connected with the first control terminal of the switching element. The second control part is connected with the second control terminal of the switching element. A projection area of the first control part on a reference plane intersects with a projection area of the second control part on the reference plane at one or more first intersections. The first power part is connected with the first power terminal of the switching element. The second power part is connected with the second power terminal of the switching element.

19 Claims, 21 Drawing Sheets

(56) References Cited

U.S. PATENT DOCUMENTS

| | | | |
|---|---|---|---|
| 2016/0133597 A1 | 5/2016 | Kouno | |
| 2017/0110395 A1* | 4/2017 | Iwabuchi | ............. H02M 7/003 |
| 2018/0056795 A1 | 3/2018 | Xu et al. | |
| 2018/0145513 A1* | 5/2018 | Kato | ................ H01L 23/49568 |
| 2020/0335492 A1 | 10/2020 | Hata et al. | |

FOREIGN PATENT DOCUMENTS

| | | |
|---|---|---|
| JP | 2001148458 A | 5/2001 |
| JP | 2003068780 A | 3/2003 |
| JP | 2004363339 A | 12/2004 |
| JP | 2007043146 A | 2/2007 |
| JP | 2013021799 A | 1/2013 |
| JP | 2015015301 A | 1/2015 |

\* cited by examiner

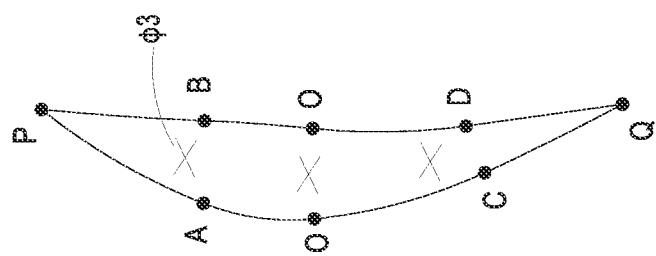
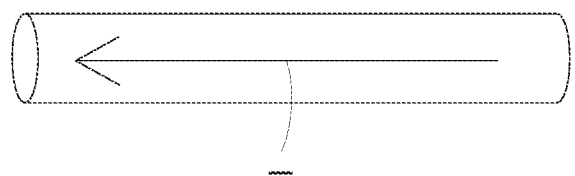
FIG. 6

SWITCHING MODULE

CROSS-REFERENCE TO RELATED APPLICATION

This application claims priority to China Patent Application No. 202110263916.6, filed on Mar. 11, 2021, the entire contents of which are incorporated herein by reference for all purposes.

FIELD OF THE INVENTION

The present disclosure relates to a switching module, and more particularly to a switching module for reducing the mutual inductance between a power loop and a control loop and reducing the self-inductance in the control loop.

BACKGROUND OF THE INVENTION

Generally, a switching module of a power electronic system is operated at a high frequency to achieve high power density. However, the high operating frequency may increase the switching loss, and thus reduce the efficiency of the switching module. Consequently, when the switching module is operated at the high frequency, it is necessary to increase the switching speed of the control terminal of the switching module in order to reduce the switching loss. However, when the switching module is operated at the higher switching speed, a serious electromagnetic interference (EMI) problem occurs.

Especially, in case that the switching module has a high power density structure, the distance between the power loop and the control loop in the switching module is relatively short. When the current in the power loop changes, an induced magnetic field is generated around the power loop. When the induced magnetic field passes through the control loop, a corresponding induced voltage is generated. Consequently, the electromagnetic interference caused by the mutual inductance between the power loop and the control loop is generated. Due to the electromagnetic interference of the mutual inductance, the switching process of the switching module is impacted. If the electromagnetic interference caused by the mutual inductance is too large and thus the interference voltage is increased, the voltage across the control terminal may exceed the safe range. Under this circumstance, the reliability of the switching module is reduced, and the switching module may even be unable to work normally.

In addition to the electromagnetic interference caused by the mutual inductance between the power loop and the control loop, there is also self-induced electromagnetic interference in the control loop. When the current through the control loop changes, an induced magnetic field is generated around the control loop and thus a self-induced electromagnetic interference is generated. The self-inductance of the control loop is in proportion to the area of the control loop. If the self-inductance is large, it is easy to cause the oscillation during the switching process. Due to the oscillation, the safety performance of the switching module is impaired.

Therefore, there is a need of providing an improved switching module in order to overcome the drawbacks of the conventional technologies.

SUMMARY OF THE INVENTION

The present disclosure provides a switching module for reducing the mutual inductance between a power loop and a control loop and reducing the self-inductance in the control loop.

In accordance with an aspect of the present disclosure, a switching module is provided. The switching module includes at least one substrate, at least one switching element, at least one first control part, at least one second control part, at least one first power part and at least one second power part. The at least one switching element is disposed on the substrate. Each switching element includes a first control terminal, a second control terminal, a first power terminal and a second power terminal. The at least one first control part is connected with the first control terminal of the corresponding switching element. The at least one second control part is connected with the second control terminal of the corresponding switching element. A projection area of the first control part on a reference plane intersects with a projection area of the second control part on the reference plane at one or more first intersections. The at least one first power part is connected with the first power terminal of the corresponding switching element. The at least one second power part is connected with the second power terminal of the corresponding switching element.

The above contents of the present disclosure will become more readily apparent to those ordinarily skilled in the art after reviewing the following detailed description and accompanying drawings, in which:

BRIEF DESCRIPTION OF THE DRAWINGS

FIG. 6 schematically illustrates that the mutual inductance of the outer magnetic field is crossly countervailed by the control loop of the switching module of FIG. 1 along a lateral direction;

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
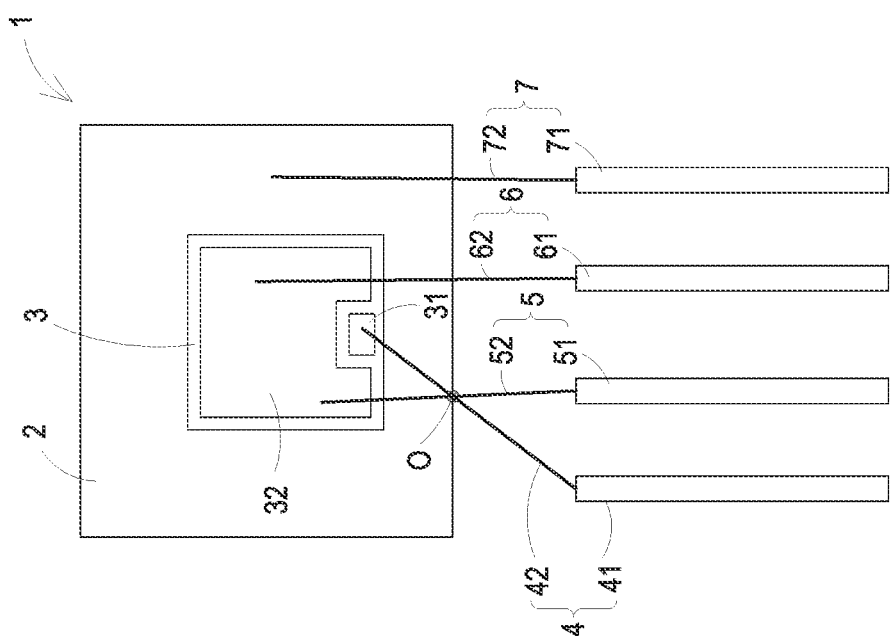
FIG. 1 is a schematic view illustrating the structure of a switching module according to a first embodiment of the present disclosure.
Figure 2:
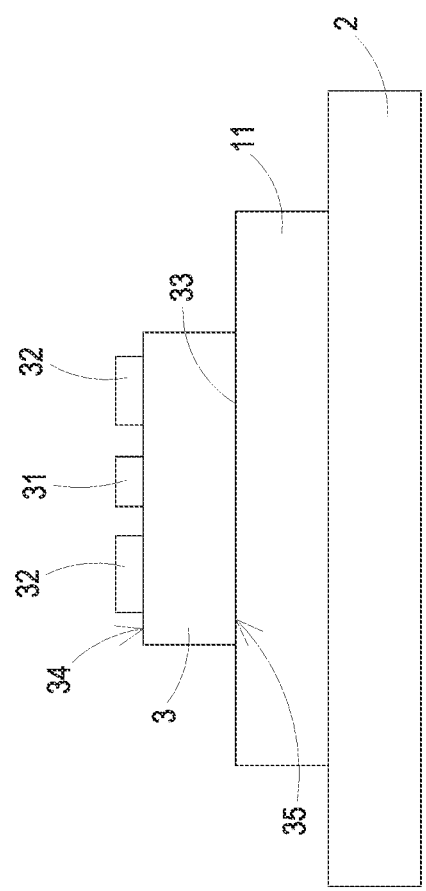
FIG. 2 is a schematic side view illustrating a portion of the switching module as shown in FIG. 1.
Figure 3:
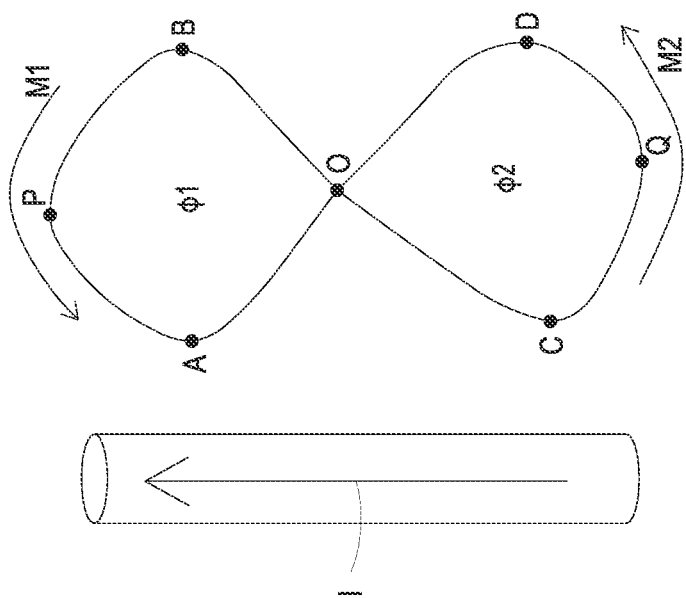
FIG. 3 schematically illustrates how the mutual inductance between the power loop and the control loop of the switching module of FIG. 1 is countervailed.
Figure 4:
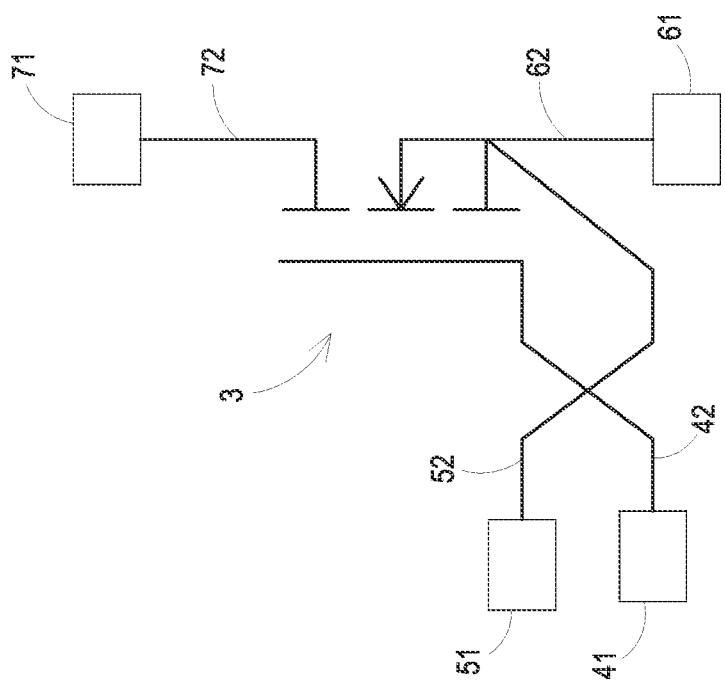
FIG. 4 is a schematic circuit diagram of the switching module as shown in FIG. 1.

Please refer to FIGS. 1, 2, 3 and 4. FIG. 1 is a schematic view illustrating the structure of a switching module according to a first embodiment of the present disclosure. FIG. 2 is a schematic side view illustrating a portion of the switching module as shown in FIG. 1. FIG. 3 schematically illustrates how the mutual inductance between the power loop and the control loop of the switching module of FIG. 1 is countervailed. FIG. 4 is a schematic circuit diagram of the switching module as shown in FIG. 1.

The switching module 1 is disposed on a main circuit board (not shown) and electrically connected with the main circuit board. In an embodiment, the switching module 1 includes a substrate 2, a switching element 3, a first control part 4, a second control part 5, and a first power part 6 and a second power part 7.

In an embodiment, the switching element 3 is a vertical device. Preferably but not exclusively, the switching element 3 is an insulated gate bipolar transistor (IGBT), a bipolar junction transistor (BJT), a metal-oxide-semiconductor field-effect transistor (MOSFET), a junction field effect transistor (JFET) or a gallium nitride high electron mobility transistor (GaN-HEMT).

The switching element 3 is bonded on the substrate 2 through a connecting material 11. The switching element 3 includes a first control terminal 31, a second control terminal 32, a first power terminal 32 and a second power terminal 33. The first control terminal 31 and the second control terminal 32 (and the first power terminal) are disposed on a first surface 34 of the switching element 3. The second control terminal and the first power terminal are located at the same region of the switching element 3, and are designated by identical numeral reference 32. The second power terminal 33 is disposed on a second surface 35 of the switching element 3. The second power terminal 33 is connected with the substrate 2 through the connecting material 11.

In some embodiments, in case that the switching element 3 is an insulated gate bipolar transistor (IGBT), the first control terminal 31 is served as a gate terminal of the switching element 3, the second control terminal 32 and the first power terminal 32 are collaboratively formed as an emitter of the switching element 3, and the second power terminal 33 is served as a collector of the switching element 3. In some other embodiments, in case that the switching element 3 is a bipolar junction transistor (BJT), the first control terminal 31 is served as a base of the switching element 3, the second control terminal 32 and the first power terminal 32 are collaboratively formed as an emitter of the switching element 3, and the second power terminal 33 is served as a collector of the switching element 3. In some other embodiments, in case that the switching element 3 is a metal-oxide-semiconductor field-effect transistor (MOSFET), a junction field effect transistor (JFET) or a gallium nitride high electron mobility transistor (GaN-HEMT), the first control terminal 31 is served as a gate terminal of the switching element 3, the second control terminal 32 and the first power terminal 32 are collaboratively formed as a source terminal of the switching element 3, and the second power terminal 33 is served as a drain terminal of the switching element 3.

In the circuit diagram of FIG. 4, the switching element 3 is a metal-oxide-semiconductor field-effect transistor (MOSFET). The circuit diagram of the switching module 1 of FIG. 1 is shown in FIG. 4.

The first control part 4 is connected with the first control terminal 31 of the switching element 3. The first control part 4 includes a first control pin 41 and a first conductor 42. The first conductor 42 is connected between the first control pin 41 and the first control terminal 31 of the switching element 3. The second control part 5 is connected with the second control terminal 32 of the switching element 3. The second control part 5 includes a second control pin 51 and a second conductor 52. The second conductor 52 is connected between the second control pin 51 and the second control terminal 32 of the switching element 3. Moreover, a control loop of the switching module 1 is defined by the second control terminal 32, the second conductor 52, the second pin 51, the main circuit board, the first control pin 41, the first conductor 42 and the first control terminal 31 collaboratively.

In an embodiment, the plane of the substrate 2 is a reference plane. The projection area of the first control part 4 on the reference plane intersects with the projection area of the second control part 5 on the reference plane at an intersection O. For example, the projection area of the first conductor 42 of the first control part 4 on the reference plane intersects with the projection area of the second conductor 52 of the second control part 5 on the reference plane at the intersection O.

The first power part 6 is connected with the first power terminal 32 of the switching element 3. The first power part 6 includes a first power pin 61 and a third conductor 62. The third conductor 62 is connected between the first power pin 61 and the first power terminal 32 of the switching element 3. The second power part 7 is connected with the substrate 2. Consequently, the second power part 7 is connected with the second power terminal 33 of the switching element 3 via the substrate 2. The second power part 7 includes a second power pin 71 and a fourth conductor 72. The fourth conductor 72 is connected between the substrate 2 and the second power pin 71. The fourth conductor 72 is connected with the second power terminal 33 of the switching element 3 through the substrate 2. Moreover, a power loop of the switching module 1 is defined by the second power terminal 33, the substrate 2, the fourth conductor 72, the second power pin 71, the main circuit board, the first power pin 61, the third conductor 62 and the first power terminal 32 collaboratively. As shown in FIG. 1, the first control pin 41, the second control pin 51, the first power pin 61 and the second power pin 71 are arranged sequentially.

Please refer to FIG. 3. The point A and the point D denote the two ends of the first control part 4. The point B and the point C denote the two ends of the second control part 5. The point P denotes the connection point connecting the first control terminal 31 of the switching element 3 and the second control terminal 32 (and the first power terminal 32). The point Q denotes a connection point in the main circuit board. The reference label I denotes the current flowing through the power loop. In this embodiment, the point O is the intersection of the first conductor 42 and the second conductor 52. The control loop of the switching module 1 is divided into two sub-control loops. The first sub-control loop is defined by the points O, B, P and A collaboratively. The second sub-control loop is defined by the points O, C, Q and D collaboratively. In case that the integration level of the control loop is high, the area of the first sub-control loop is equal to or similar to the area of the second sub-control loop. Consequently, the magnetic fluxes generated by the current I of the power loop and passing through the two sub-control loops are equal or similar. That is, the magnetic flux $\Phi 1$ of the first sub-control loop is equal to or substantially equal to the magnetic flux $\Phi 2$ of the second sub-control loop, the mutual inductance M1 between the power loop and the first sub-control loop is equal to or substantially equal to the mutual inductance M2 between the power loop and the second sub-control loop. Since the current direction of the first sub-control loop and the current direction of the second sub-control loop are opposite, the mutual inductance M1 between the power loop and the first sub-control loop and the mutual inductance M2 between the power loop and the second sub-control loop have opposite signs. Preferably but not exclusively, the mutual inductance M1 is equal to the mutual inductance M2. In other words, the sum of the mutual inductance M1 between the power loop and the first sub-control loop and the mutual inductance M2 between the power loop and the second sub-control loop is zero. Since the mutual inductance between the power loop and the overall control loop is zero, the purpose of reducing the mutual inductance between the power loop and the control loop is achieved.

As mentioned above, the point O is the intersection between the first conductor 42 and the second conductor 52. Consequently, the area of the control loop is equal to the area of the first sub-control loop plus the area of the second sub-control loop, i.e., the area enclosed by the points O, B, P and A plus the area enclosed by the points O, C, Q and D. In comparison with the conventional control loop without the intersection, the area of the control loop in the switching module 1 is reduced by the area formed by points A, O and D and the area formed by points B, O and D, and thus the self-inductance of the control loop is reduced.

As mentioned above, the projection area of the first conductor 42 of the first control part 4 on the reference plane intersects the projection area of the second conductor 52 of the second control part 5 on the reference plane at the intersection O. In comparison with the conventional switching module, the mutual inductance between the control loop and the power loop in the switching module 1 of the present disclosure is reduced. As both the mutual inductance between the control loop and the power loop and the self-inductance of the control loop in the switching module 1 is reduced, the safety performance of the switching module 1 is enhanced.

Figure 5:
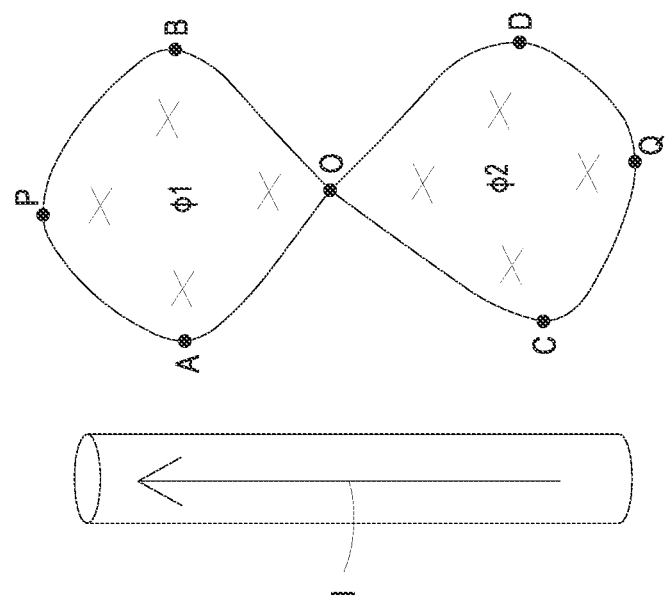
FIG. 5 schematically illustrates that the mutual inductance of the outer magnetic field is crossly countervailed by the control loop of the switching module of FIG. 1 along a magnetic flux direction.

The positional relationships between the control loop and the power loop shown in FIG. 3 are all projection diagrams. For example, the projections are projected on the substrate 2. It is understandable that the first control part 4 and the second control part 5 in FIG. 1 may not be completely on the same plane. In particular, the first conductor 42 of the first control part 4 and the second conductor 52 of the second control part 5 may not be completely coplanar. That is, the first conductor 42 of the first control part 4 and the second conductor 52 of the second control part 5 are not coplanar. From the side view of the structure shown in FIG. 1, for example in the projection on the plane perpendicular to the plane of the substrate 2, another area surrounded by the first control part 4 and the second control part 5 can be seen, as shown in the area enclosed by PAOCQDOB shown in FIG. 6. On the basis of FIG. 3, FIG. 5 further marks the directions of the magnetic fluxes $\Phi 1$ and $\Phi 2$ passing through the two sub-control loops when the current I of the power loop is greater than zero. The directions of the magnetic fluxes $\Phi 1$ and $\Phi 2$ passing through the two sub-control loops are identical. Since the current flowing through the two sub-control loops are opposed to each other, the direction of the mutual inductances M1 and M2 are opposite. The total mutual inductance between the power loop and the two sub-control loop is M1+M2. When the magnetic fluxes $\Phi 1$ and $\Phi 2$ are similar or equal, the magnitudes of the mutual inductances M1 and M2 are also similar or equal, and the total mutual inductance M1+M2 is close to 0 or equal to 0, and the effect is as described above. However, if the values of the magnetic fluxes $\Phi 1$ and $\Phi 2$ differ greatly (i.e., $\Phi 1 > \Phi 2$ or $\Phi 1 < \Phi 2$), the value of the total mutual inductance M1+M2 will differ greatly from zero. Then, the third magnetic flux $\Phi 3$ can be introduced for compensation. FIG. 6 shows the projection of the current I through the power loop and the projection of the control loop on the side surface. The projection of the current I through the power loop to the lateral direction is above the projection of the control loop on the side surface. Accordingly, the magnetic flux of the magnetic field generated by the current I through the power loop upon the projection of the control loop on the side surface (i.e., the PAOCQDOB area) is $\Phi 3$, the direction of the magnetic flux $\Phi 3$ is shown, and the mutual inductance of the magnetic flux $\Phi 3$ in the entire control loop is defined as M3. Taking $\Phi 1 < \Phi 2$ as an example, the total mutual inductance M1+M2<0, the compensation of the magnetic flux $\Phi 3$ can make the total mutual inductance M1+M2+M3 be equal to 0. The magnetic flux in the area formed by the projections of the first control part 4 and the second control part 5 on the side surface is used to compensate the magnetic flux in the area formed by the projections of the first control part 4 and the second control part 5 on the reference plane, so that the total magnetic flux through the control loop formed by the first control part 4 and the second control part 5 is reduced. Preferably but not exclusively, the total magnetic flux is reduced to zero. As a result, the mutual inductance between the power loop and the entire control loop is reduced. In this case, the projection of the first control part 4 on the side surface is between the projection of the second control part 5 on the side surface and the projection of the current I through the power loop on the side surface. That is, the projection of the first control part 4 on the side surface is between the projection of the second control part 5 on the side surface and the projection of the first power part 6 on the side surface, or the projection of the first control part 4 on the side surface is between the projection of the second control part 5 on the side surface and the projection of the second power part 7 on the side surface. In other cases, the total mutual inductance M1+M2+M3=0 can also be achieved by introducing the magnetic flux Φ3 of the side projection. That is, the mutual inductance is reduced. In case that Φ1>Φ2, the compensation effect is also achieved by the magnetic flux Φ3 on the projections of the first control part 4 and the second control part 5 on the side surfaces. Then the projection of the second control part 5 on the side surface is between the projection of the first control part 4 on the side surface and the projection of the current I through the power loop on the side surface. That is, the projection of the first control part 4 on the side surface is between the projection of the second control part 5 on the side surface and the projection of the first power part 6 on the side surface, or the projection of the first control part 4 on the side surface is between the projection of the second control part 5 on the side surface and the projection of the second power part 7 on the side surface. In this embodiment, the side surface intersects the reference plane. Preferably but not exclusively, the side surface is perpendicular to the reference plane.

Figure 7B:
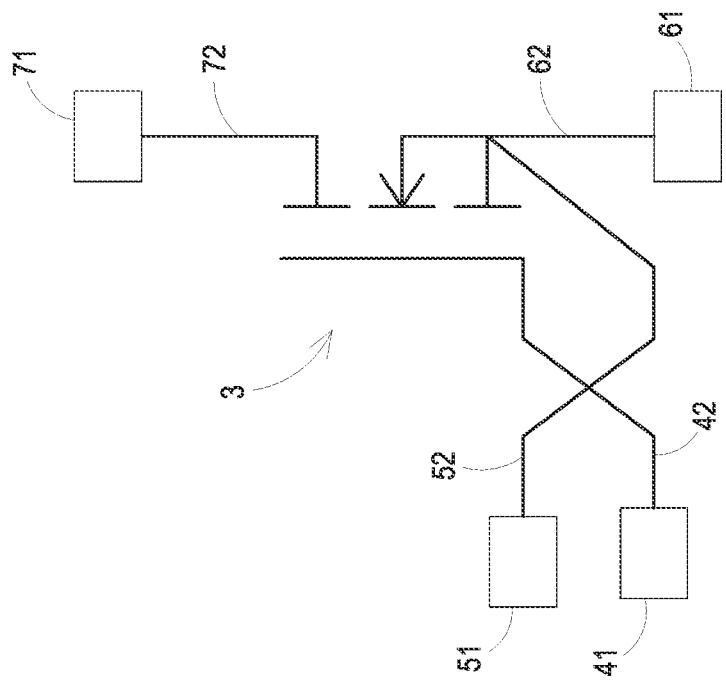
FIG. 7B is a schematic circuit diagram of the switching module as shown in FIG. 7A.
Figure 7A:
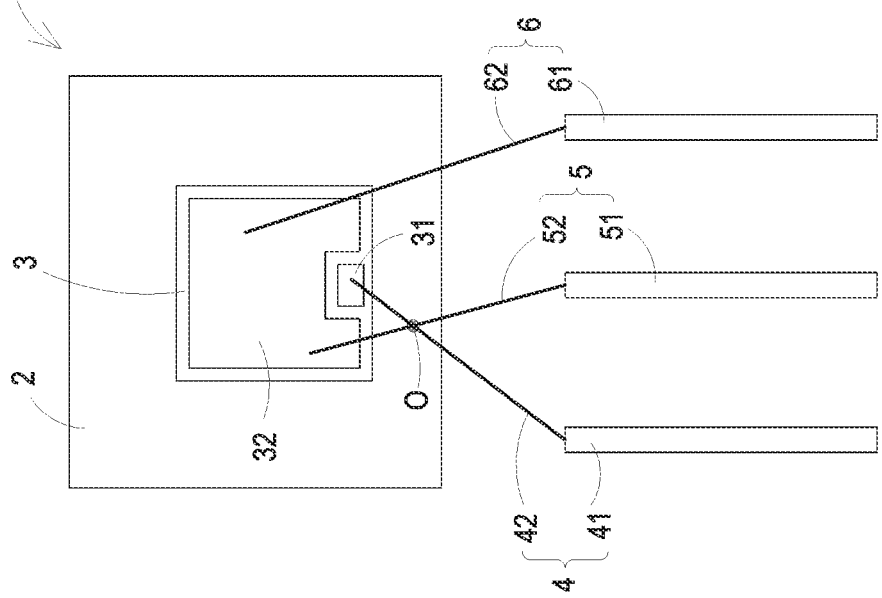
FIG. 7A is a schematic view illustrating the structure of a switching module according to a second embodiment of the present disclosure.

Please refer to FIGS. 7A and 7B. FIG. 7A is a schematic view illustrating the structure of a switching module according to a second embodiment of the present invention. FIG. 7B is a schematic circuit diagram of the switching module as shown in FIG. 7A. The structures and functions of the components of the switching module 1a which are identical to those of the first embodiment are not redundantly described herein. Component parts and elements corresponding to those of the first embodiment are designated by identical numeral references. In the switching module 1a of this embodiment, the second power pin 71 is formed by a portion of the substrate 2. Since the substrate 2 of the switching module 1a is directly connected with the second power terminal 33 of the switching element 3, the second power part of the switching module 1a is not additionally equipped with the fourth conductor. In this embodiment, the power loop of the switching module 1a is defined by the second power terminal 33, the substrate 2, the main circuit board, the first power pin 61, the third conductor 62 and the first power terminal 32 collaboratively. Moreover, the first control pin 41, the second control pin 51 and the first power pin 61 are arranged sequentially.

Figure 8B:
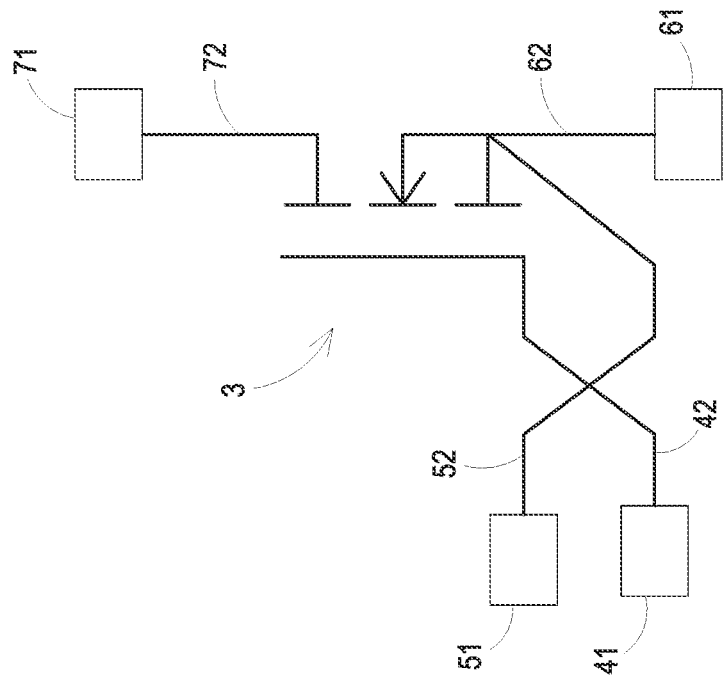
FIG. 8B is a schematic circuit diagram of the switching module as shown in FIG. 8A.
Figure 8A:
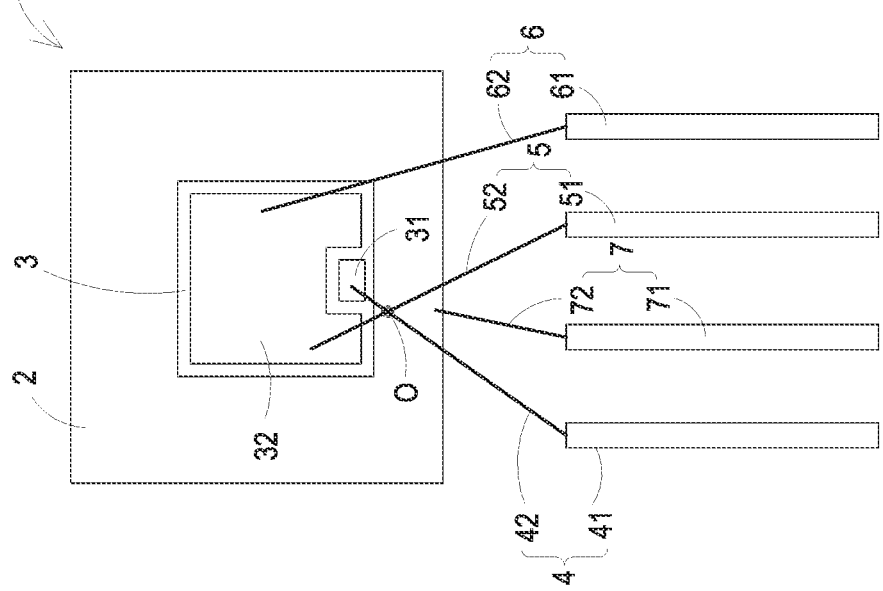
FIG. 8A is a schematic view illustrating the structure of a switching module according to a third embodiment of the present disclosure.

Please refer to FIGS. 8A and 8B. FIG. 8A is a schematic view illustrating the structure of a switching module according to a third embodiment of the present disclosure. FIG. 8B is a schematic circuit diagram of the switching module as shown in FIG. 8A. The structures and functions of the components of the switching module 1b which are identical to those of the first embodiment are not redundantly described herein. Component parts and elements corresponding to those of the first embodiment are designated by identical numeral references. In comparison with the first embodiment of FIG. 1, the arrangement positions of the first control pin 41, the second control pin 51, the first power pin 61 and the second power pin 71 in the switching module 1b of this embodiment are changed. That is, the first control pin 41, the second power pin 71, the second control pin 51 and the first power pin 61 of the switching module 1b are arranged sequentially.

Figure 9B:
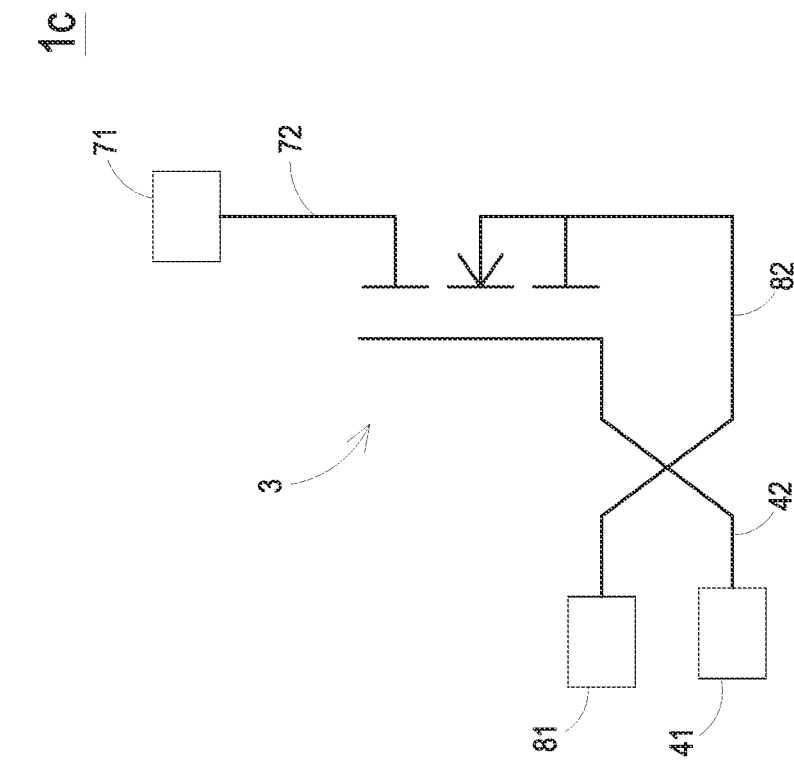
FIG. 9B is a schematic circuit diagram of the switching module as shown in FIG. 9A.
Figure 9A:
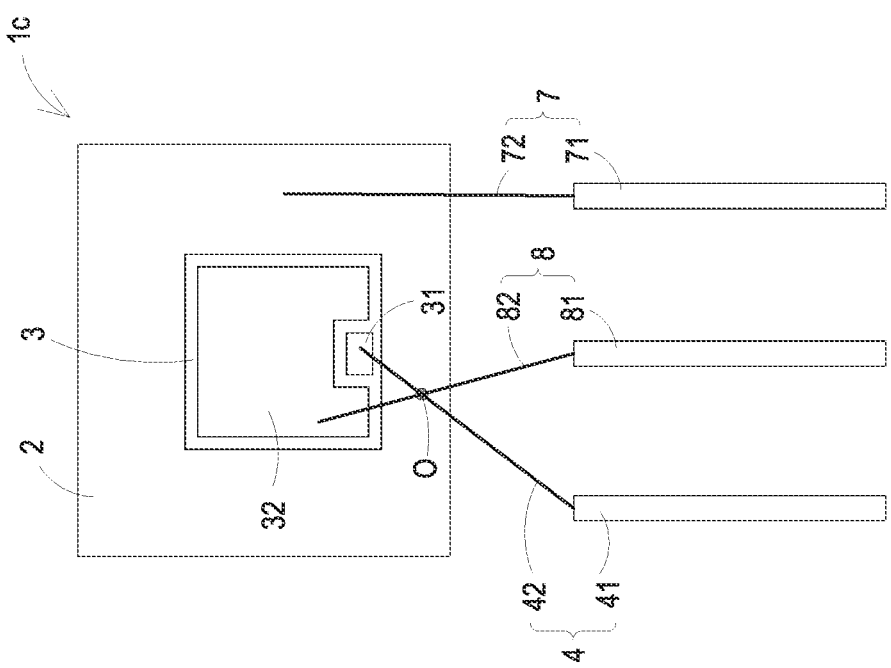
FIG. 9A is a schematic view illustrating the structure of a switching module according to a fourth embodiment of the present disclosure.

In some embodiments, the second control part and the first power part share the same part. Please refer to FIGS. 9A and 9B. FIG. 9A is a schematic view illustrating the structure of a switching module according to a fourth embodiment of the present disclosure. FIG. 9B is a schematic circuit diagram of the switching module as shown in FIG. 9A. The structures and functions of the components of the switching module 1c which are identical to those of the first embodiment are not redundantly described herein. Component parts and elements corresponding to those of the first embodiment are designated by identical numeral references. In the embodiment of FIG. 1, the second control part 5 and the first power part 6 of the switching module 1 are separately arranged. Whereas, in the switching module 1c of this embodiment, the second control part and the first power part share a common part 8. The common part 8 is connected with the second control terminal 32 (and the first power terminal 32) of the switching element 3. The common part 8 includes a fifth pin 81 and a fifth conductor 82. The fifth pin 81 is served as the second control pin of the second control part and the first power pin of the first power part. The fifth conductor 82 is connected between the second control terminal 32 (and the first power terminal 32) of the switching element 3 and the fifth pin 81. The fifth conductor 82 can be used as the second conductor of the second control part and the third conductor of the first power part collaboratively. In an embodiment, the plane of the substrate 2 is reference plane. Moreover, the projection area of the first conductor 42 of the first control part 4 on the reference plane intersects with the projection area of the fifth conductor 82 of the common part 8 on the reference plane at an intersection O. In this embodiment, the first control pin 41, the fifth pin 81 and the second power pin 71 are arranged sequentially.

Figure 10B:
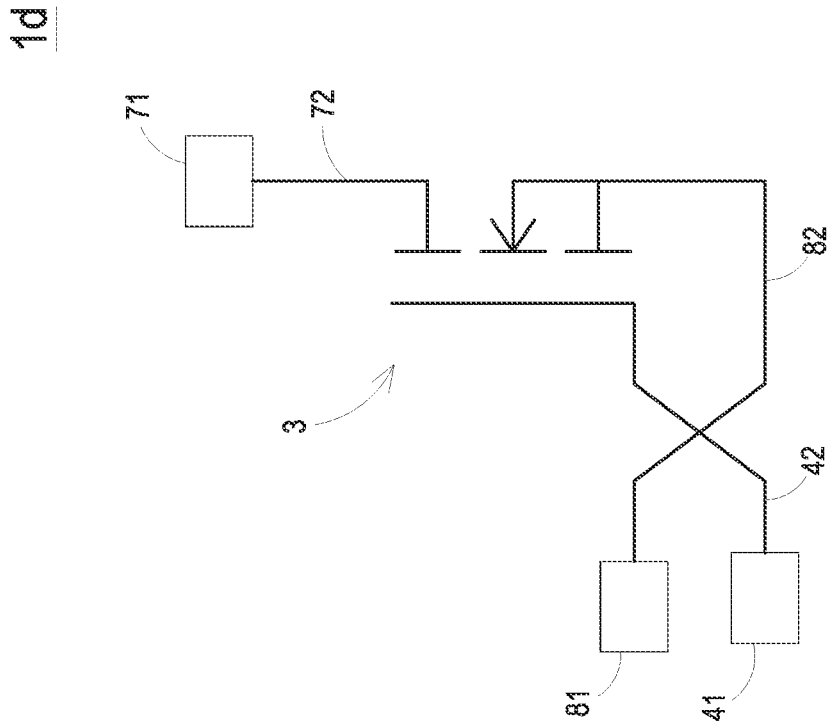
FIG. 10B is a schematic circuit diagram of the switching module as shown in FIG. 10A.
Figure 10A:
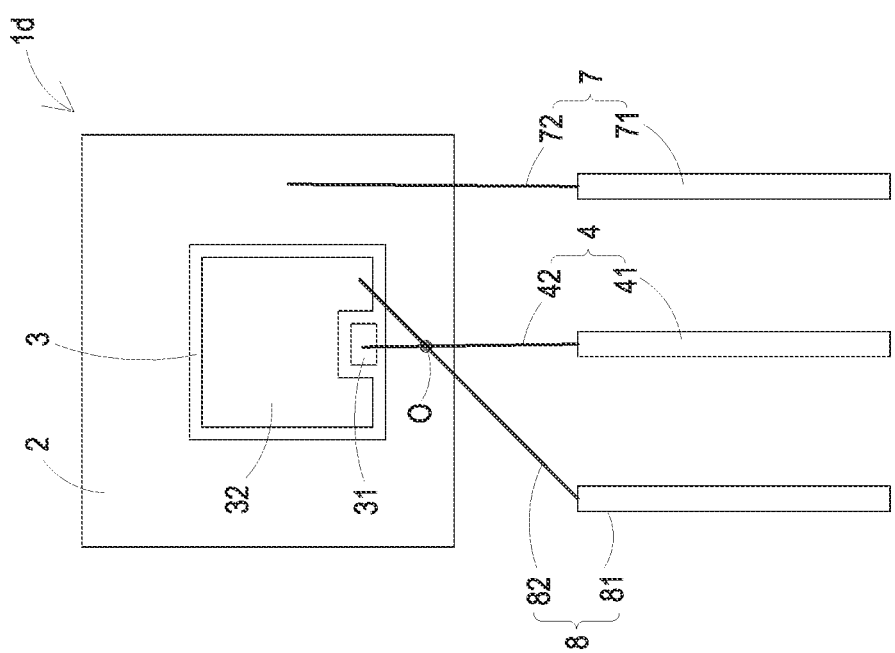
FIG. 10A is a schematic view illustrating the structure of a switching module according to a fifth embodiment of the present disclosure.

Please refer to FIGS. 10A and 10B. FIG. 10A is a schematic view illustrating the structure of a switching module according to a fifth embodiment of the present disclosure. FIG. 10B is a schematic circuit diagram of the switching module as shown in FIG. 10A. The structures and functions of the components of the switching module 1d which are identical to those of the switching module 1c of the fourth embodiment are not redundantly described herein. Component parts and elements corresponding to those of the first embodiment are designated by identical numeral references. In comparison with the fourth embodiment of FIGS. 9A and 9B, the arrangement positions of the associated pins are changed. That is, the fifth pin 81, the first control pin 41 and the second power pin 71 in the switching module 1d of this embodiment are arranged sequentially.

Figure 11B:
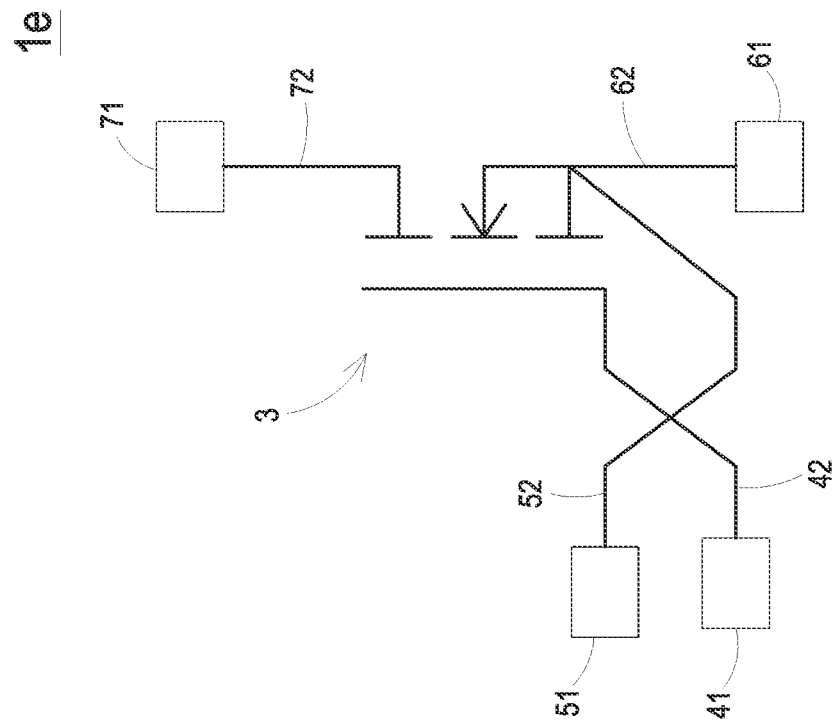
FIG. 11B is a schematic circuit diagram of the switching module as shown in FIG. 11A.
Figure 11A:
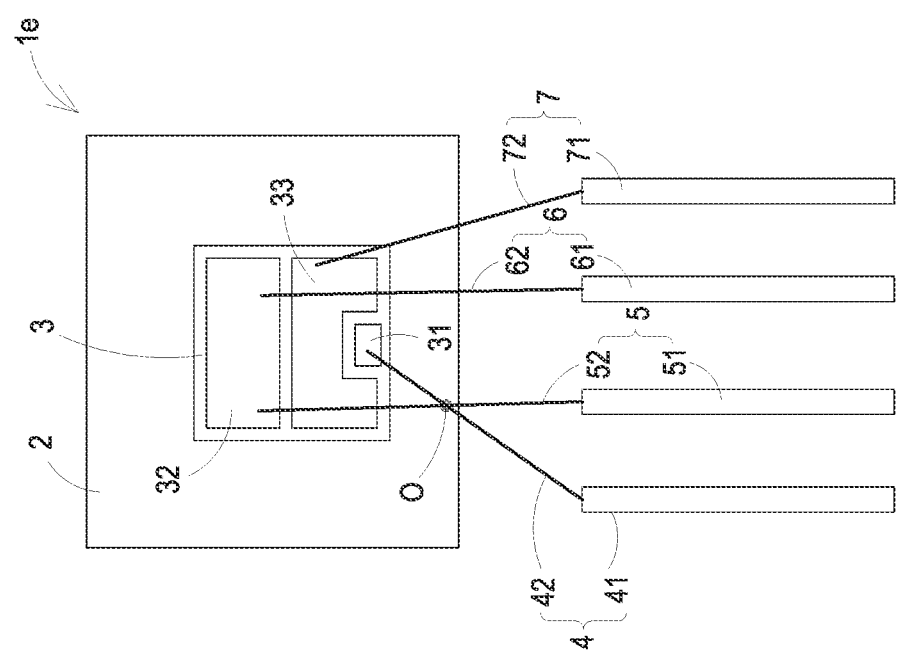
FIG. 11A is a schematic view illustrating the structure of a switching module according to a sixth embodiment of the present disclosure.

Please refer to FIGS. 11A and 11B. FIG. 11A is a schematic view illustrating the structure of a switching module according to a sixth embodiment of the present disclosure. FIG. 11B is a schematic circuit diagram of the switching module as shown in FIG. 11A. The structures and functions of the components of the switching module 1e which are identical to those of the first embodiment are not redundantly described herein. Component parts and elements corresponding to those of the first embodiment are designated by identical numeral references. In the switching module 1 of the first embodiment, the second power terminal 33 is disposed on the second surface 35 of the switching element 3. In comparison with the first embodiment, the first control terminal 31, the second control terminal 32 (and the first power terminal 32) and the second power terminal 33 of the switching module 1e of this embodiment are disposed on the first surface 34 of the switching element 3. In other words, the switching element 3 of the switching module 1e is a planar switching element such as a gallium nitride high electron mobility transistor (GaN-HEMT) or a low voltage metal-oxide-semiconductor field-effect transistor (MOS-FET). Under this circumstance, the second power part 7 is directly connected with the second power terminal 33 of the switching element 3 without the need of being contacted with the substrate 2.

Figure 12A:
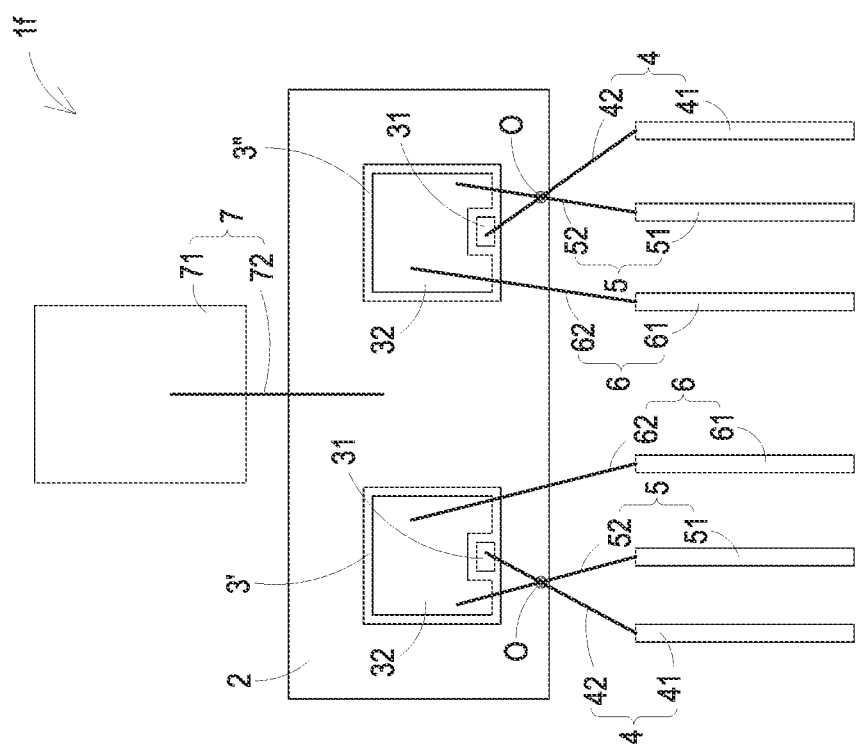
FIG. 12A is a schematic view illustrating the structure of a switching module according to a seventh embodiment of the present disclosure.
Figure 12B:
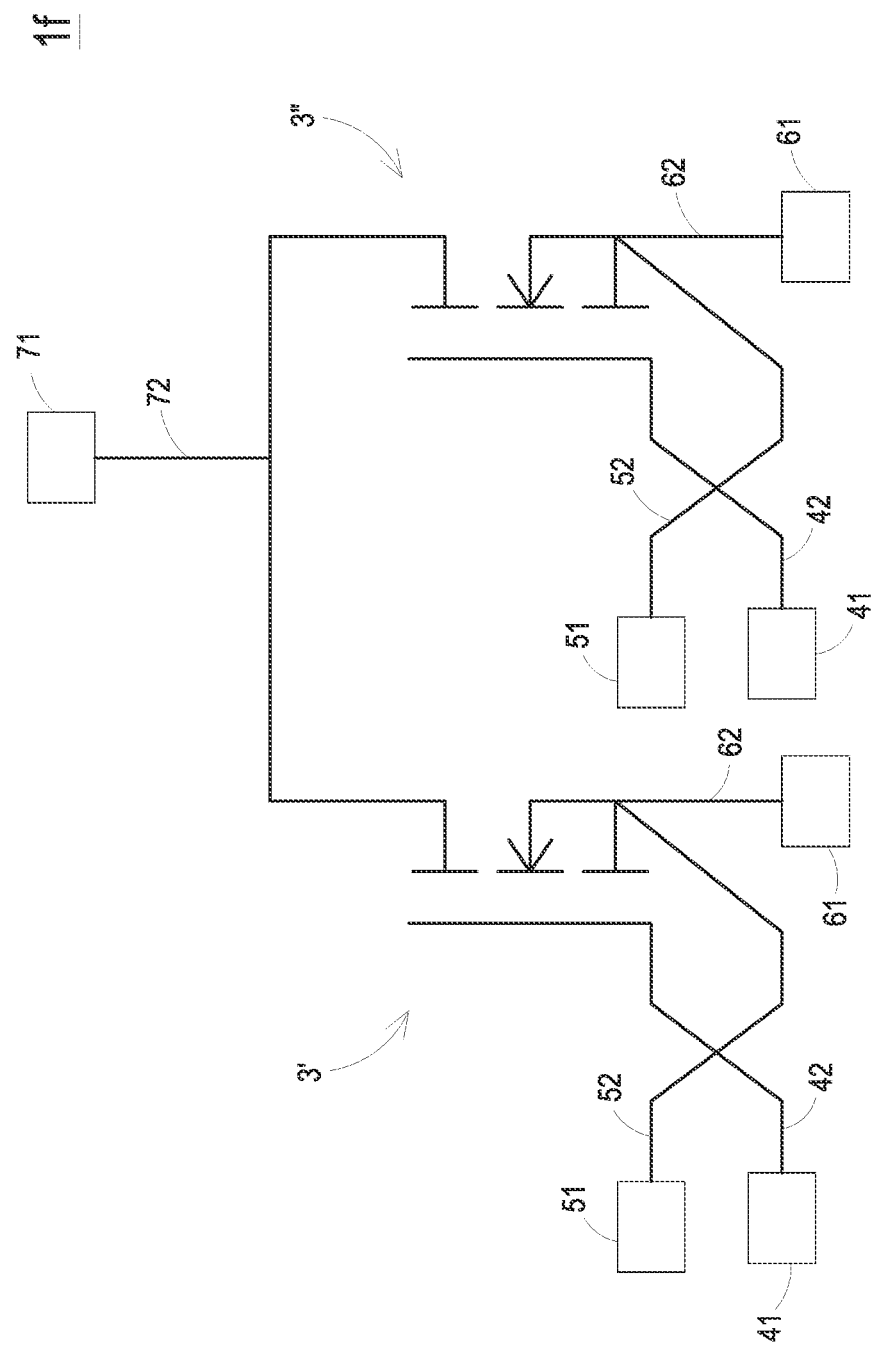
FIG. 12B is a schematic circuit diagram of the switching module as shown in FIG. 12A.

Please refer to FIGS. 12A and 12B. FIG. 12A is a schematic view illustrating the structure of a switching module according to a seventh embodiment of the present disclosure. FIG. 12B is a schematic circuit diagram of the switching module as shown in FIG. 12A. The structures and functions of the components of the switching module if which are identical to those of the first embodiment are not redundantly described herein. Component parts and elements corresponding to those of the first embodiment are designated by identical numeral references. In this embodiment, the switching module if includes two switching elements (i.e., a first switching element 3' and a second switching element 3"), two first control parts 4, two second control parts 5, two first power parts 6 and a second power part 7. The second power terminal of the first switching element 3' and the second power terminal of the second switching element 3" are connected with each other. In an embodiment, the plane of the substrate 2 is a reference plane. The projection area of the first conductor 42 of the first switching element 3' on the reference plane intersects with the projection area of the second conductor 52 of the first switching element 3' on the reference plane at an intersection O. The projection area of the first conductor 42 of the second switching element 3" on the reference plane intersects with the projection area of the second conductor 52 of the second switching element 3" on the reference plane at another intersection O. The switching module of this embodiment may be modified as long as the projection areas of first control part 4 of one switch on the reference plane intersects with the second control part 5 of said one switch on the reference plane.

In an embodiment, the first control pin 41 of the first control part 4 adjacent to the first switching element 3', the second control pin 51 of the second control part 5 adjacent to the first switching element 3', the first power pin 61 of the first power part 6 adjacent to the first switching element 3', the first power pin 61 of the first power part 6 adjacent to the second switching element 3", the second control pin 51 of the second control part 5 adjacent to the second switching element 3" and the first control pin 41 of the first control part 4 adjacent to the second switching element 3" are arranged sequentially. It is noted that the arrangement positions of the two first control pins 41, two second control pins 51, two first power pins 61 and a second power pin 7 are not restricted. Certainly, in some other embodiments, the power module if includes a single first power pin 61. That is, the first power pin 61 is shared by the first switching element 3' and the second switching element 3".

Figure 13A:
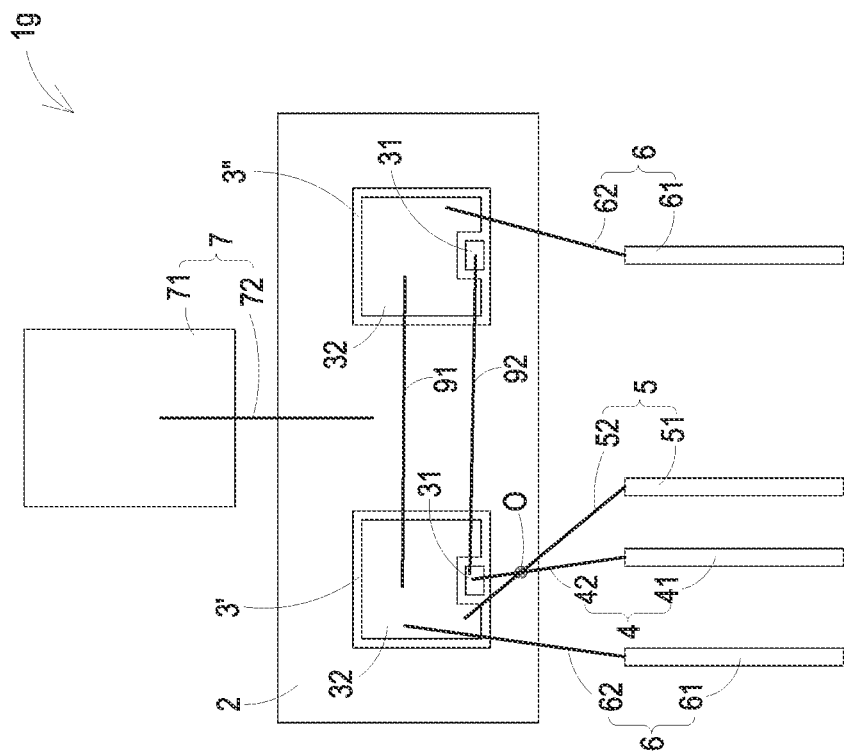
FIG. 13A is a schematic view illustrating the structure of a switching module according to an eighth embodiment of the present disclosure.
Figure 13B:
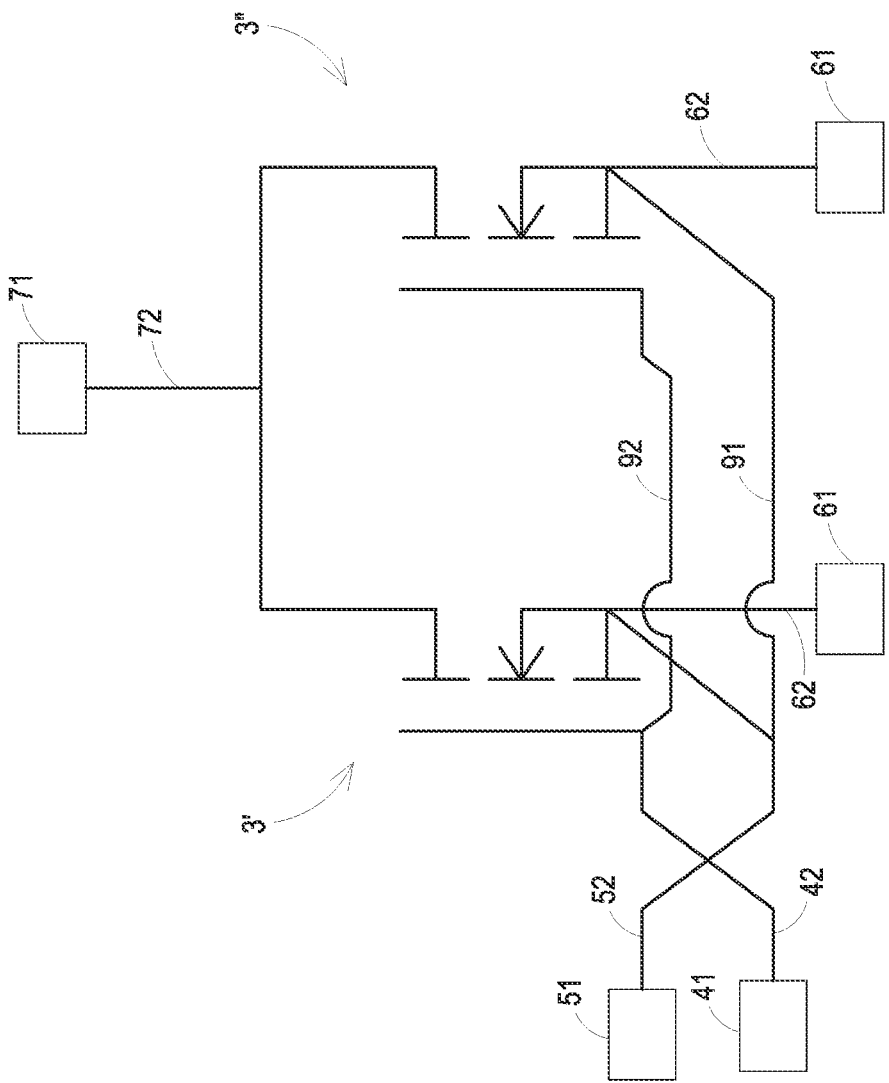
FIG. 13B is a schematic circuit diagram of the switching module as shown in FIG. 13A.

Please refer to FIGS. 13A and 13B. FIG. 13A is a schematic view illustrating the structure of a switching module according to an eighth embodiment of the present disclosure. FIG. 13B is a schematic circuit diagram of the switching module as shown in FIG. 13A. The structures and functions of the components of the switching module 1g which are identical to those of the first embodiment are not redundantly described herein. Component parts and elements corresponding to those of the first embodiment are designated by identical numeral references. In this embodiment, the switching module 1g includes two switching elements (i.e., a first switching element 3' and a second switching element 3"), a first control part 4, a second control part 5, two first power parts 6 and a second power part 7. The first switching element 3' and the second switching element 3" are connected with each other in parallel. In comparison with the switching module of FIG. 12A, one first control pin 41 and one second control pin 51 are shared by the first switching element 3' and the second switching element 3". In addition, the switching module 1g of this embodiment further includes a sixth conductor 91 and a seventh conductor 92. The sixth conductor 91 is connected between the second control terminal 32 of the first switching element 3' and the second control terminal 32 of the second switching element 3". The seventh conductor 92 is connected between the first control terminal 31 of the first switching element 3' and the first control terminal 31 of the second switching element 3". It is noted that the example of the switching module of this embodiment may be modified. For example, in some other embodiments, the switching module 1g includes a single first power pin 61. That is, the first power pin 61 is shared by the first switching element 3' and the second switching element 3".

In an embodiment, the first power pin 61 of the first power part 6 adjacent to the first switching element 3', the first control pin 41 of the first control part 4, the second control pin 51 of the second control part 5, and the first power pin 61 of the first power part 6 adjacent to the second switching element 3" are arranged sequentially. It is noted that the arrangement positions of the associated pins are not restricted.

Figure 14:
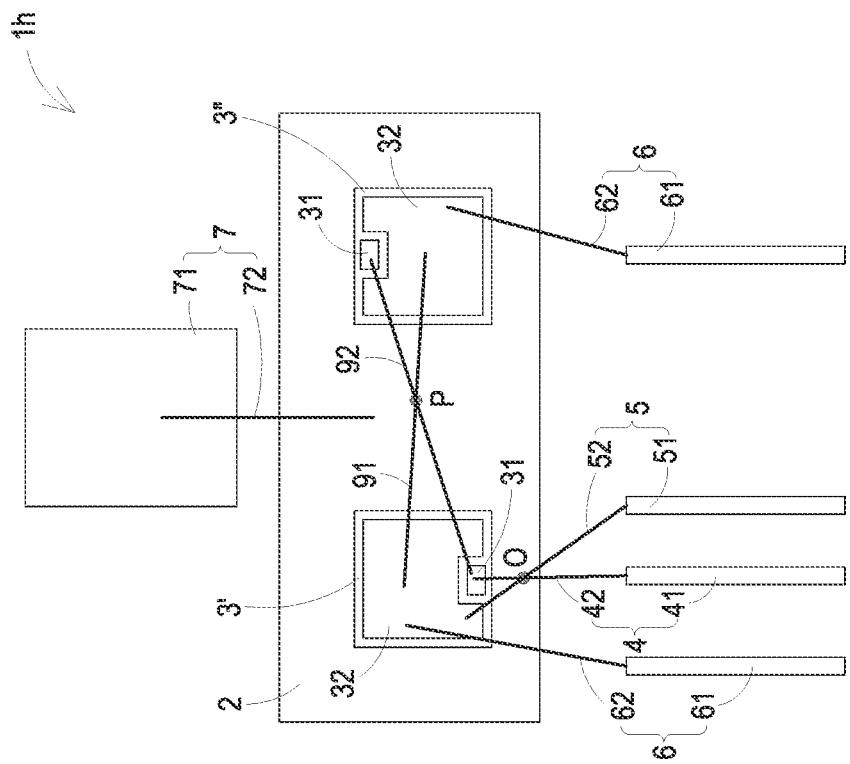
FIG. 14 is a schematic view illustrating the structure of a switching module according to a ninth embodiment of the present disclosure.

FIG. 14 is a schematic view illustrating the structure of a switching module according to a ninth embodiment of the present disclosure. In comparison with the embodiment of FIGS. 13A and 13B, the orientations of the two switching elements in the switching module 1h of this embodiment are opposite. Moreover, the projection area of the sixth conductor 91 on the reference plane intersects with the projection area of the seventh conductor 92 on the reference plane at an intersection P. In some embodiments, the substrate 2 is chosen as the reference plane. Similarly, the projection area of the first conductor 42 on the reference plane intersects with the projection area of the second conductor 52 on the reference plane at an intersection O. Since the magnetic fluxes generated by the current I through the power loop and passing through the two sub-control loops are equal or similar, the mutual inductance and the self-inductance are reduced. Moreover, the projection area of the sixth conductor 91 on the reference plane intersects with the projection area of the seventh conductor 92 on the reference plane at the intersection P. A second power loop and a second control loop are defined by the intersection P, the sixth conductor 91, the seventh conductor 92 and the associated components. Consequently, the mutual inductance between the second power loop and the second control loop is further reduced, and the self-inductance of the second control loop is further reduced.

Figure 15B:
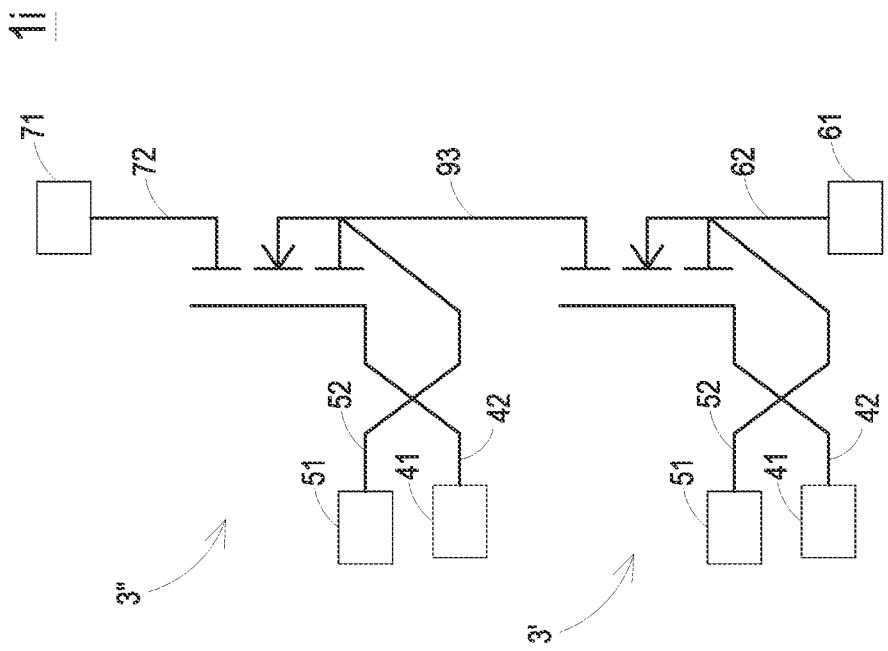
FIG. 15B is a schematic circuit diagram of the switching module as shown in FIG. 15A.
Figure 15A:
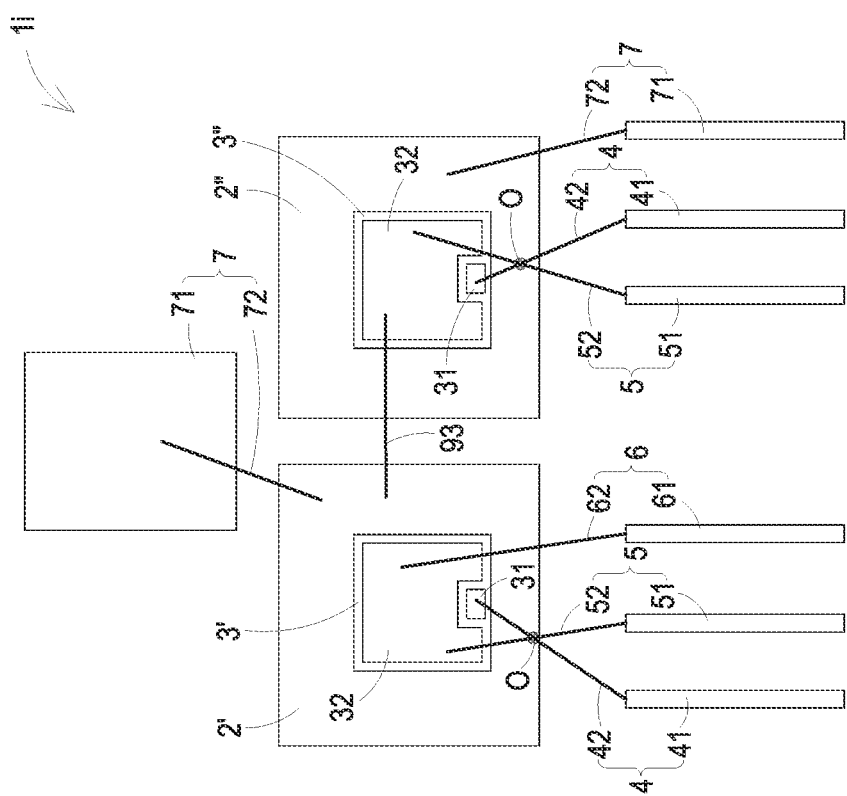
FIG. 15A is a schematic view illustrating the structure of a switching module according to a tenth embodiment of the present disclosure.

Please refer to FIGS. 15A and 15B. FIG. 15A is a schematic view illustrating the structure of a switching module according to a tenth embodiment of the present disclosure. FIG. 15B is a schematic circuit diagram of the switching module as shown in FIG. 15A. The structures and functions of the components of the switching module 1*i* which are identical to those of the first embodiment are not redundantly described herein. Component parts and elements corresponding to those of the first embodiment are designated by identical numeral references. In this embodiment, the switching module 1*i* includes two substrates (i.e., a first substrate 2' and a second substrate 2"), two switching elements (i.e., a first switching element 3' and a second switching element 3"), two first control parts 4, two second control parts 5, a first power part 6 and two second power parts 7. The first switching element 3' and the second switching element 3" are connected with each other in series. The first switching element 3' is disposed on the first substrate 2'. The second switching element 3" is disposed on the second substrate 2". In an embodiment, the planes of the first substrate 2' and the second substrate 2" are reference planes. The projection area of the first conductor 42 of first switching element 3' on the reference plane intersects with the projection area of the second conductor 52 of the first switching element 3' on the reference plane at an intersection O. The projection area of the first conductor 42 of the second switching element 3" on the reference plane intersects with the projection area of the second conductor 52 of the second switching element 3" on the reference plane at another intersection O.

The switching module 1*i* further includes an eighth conductor 93. The eighth conductor 93 is connected between the first substrate 2' and the second control terminal 32 (and the first power terminal 32) of the second switching element 3".

Figure 16:
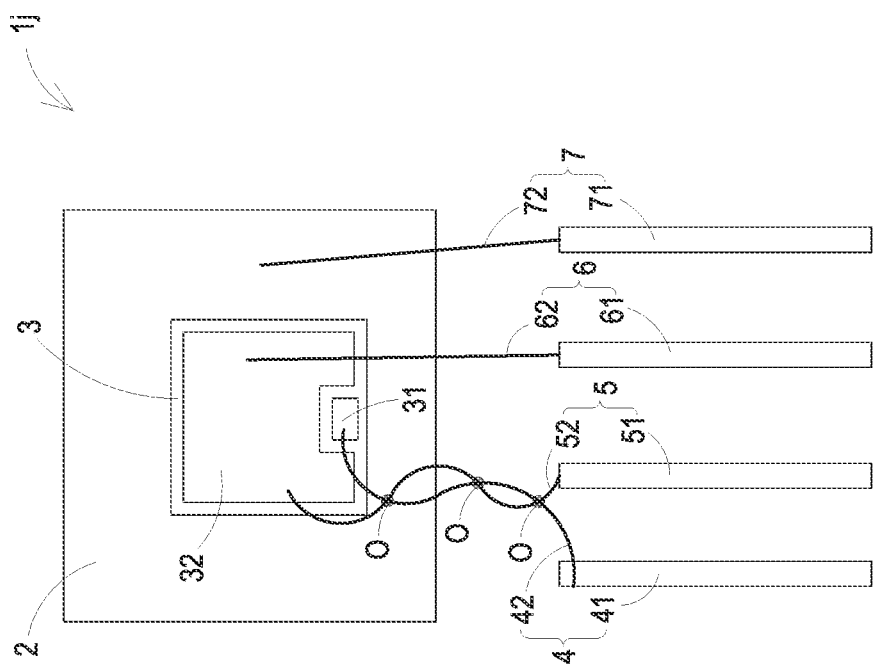
FIG. 16 is a schematic view illustrating the structure of a switching module according to an eleventh embodiment of the present disclosure.

FIG. 16 is a schematic view illustrating the structure of a switching module according to an eleventh embodiment of the present disclosure. The structures and functions of the components of the switching module 1*j* which are identical to those of the first embodiment are not redundantly described herein. Component parts and elements corresponding to those of the first embodiment are designated by identical numeral references. In this embodiment, the projection area of the first conductor 42 of the first control part 4 on the reference plane intersects with the projection area of the second conductor 52 of the second control part 5 on the reference plane at a plurality of intersections O (e.g., three intersections O). The number of the intersections O is not limited. Due to the arrangement of the plurality of intersections O, the area of the control loop in the switching module 1*j* of this embodiment is further reduced. Consequently, the self-inductance of the control loop is further reduced.

Figure 17:
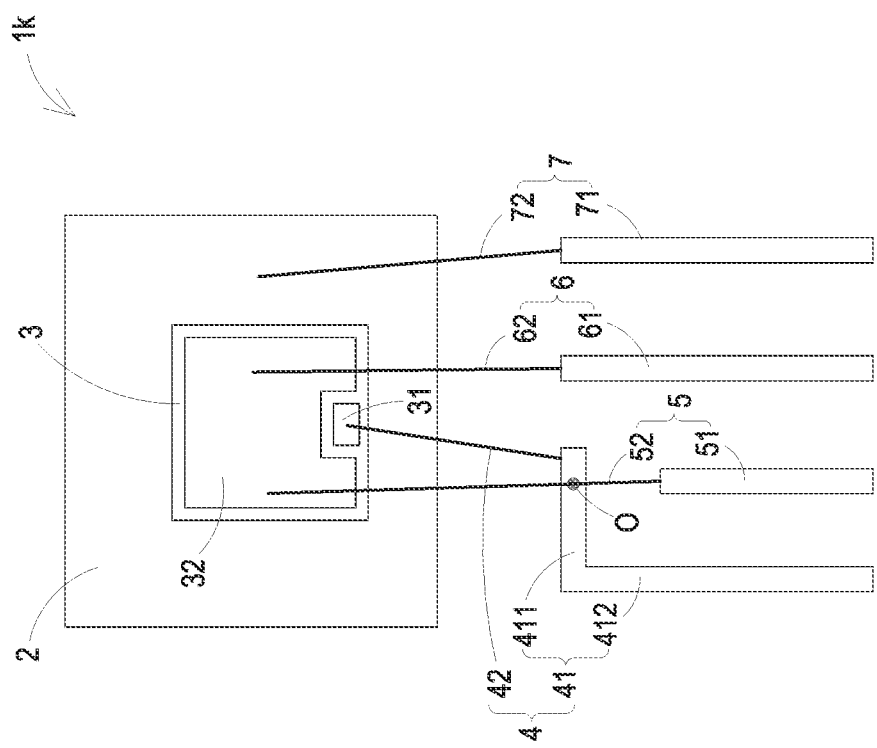
FIG. 17 is a schematic view illustrating the structure of a switching module according to a twelfth embodiment of the present disclosure.

FIG. 17 is a schematic view illustrating the structure of a switching module according to a twelfth embodiment of the present disclosure. The structures and functions of the components of the switching module 1*k* which are identical to those of the first embodiment are not redundantly described herein. Component parts and elements corresponding to those of the first embodiment are designated by identical numeral references. In comparison with the first embodiment, the first control pin 41 of the first control part 4 includes a first segment 411 and a second segment 412. The first segment 411 and the second segment 412 are perpendicular to each other. A first end of the first segment 411 and a first end of the second segment 412 are connected with each other. Preferably, the first segment 411 and the second segment 412 are integrally formed as a one-piece structure. A second end of the first segment 411 is connected with the first conductor 42. In an embodiment, the plane of the substrate 2 is reference plane. Moreover, the projection area of the first segment 411 of the first control pin 41 of the first control part 4 on the reference plane intersects with the projection area of the second conductor 52 of the second control part 5 on the reference plane at an intersection O. For example, the projection area of the first segment 411 of the first control pin 41 of the first control part 4 on the substrate 2 intersects with the projection area of the second conductor 52 of the second control part 5 on the substrate 2 at the intersection O. It is noted that the switching module of this embodiment may be modified. For example, in another embodiment, the angle between the first segment 411 and the second segment 412 is not restricted to 90 degrees. Alternatively, in another embodiment, the projection area of the first segment 411 of the first control pin 41 of the first control part 4 on the reference plane intersects with the projection area of the second conductor 52 of the second control part 5 on the reference plane at a plurality of intersections O. The number of the intersections O is not limited and is adjustable according to the practical requirements.

Figure 18:
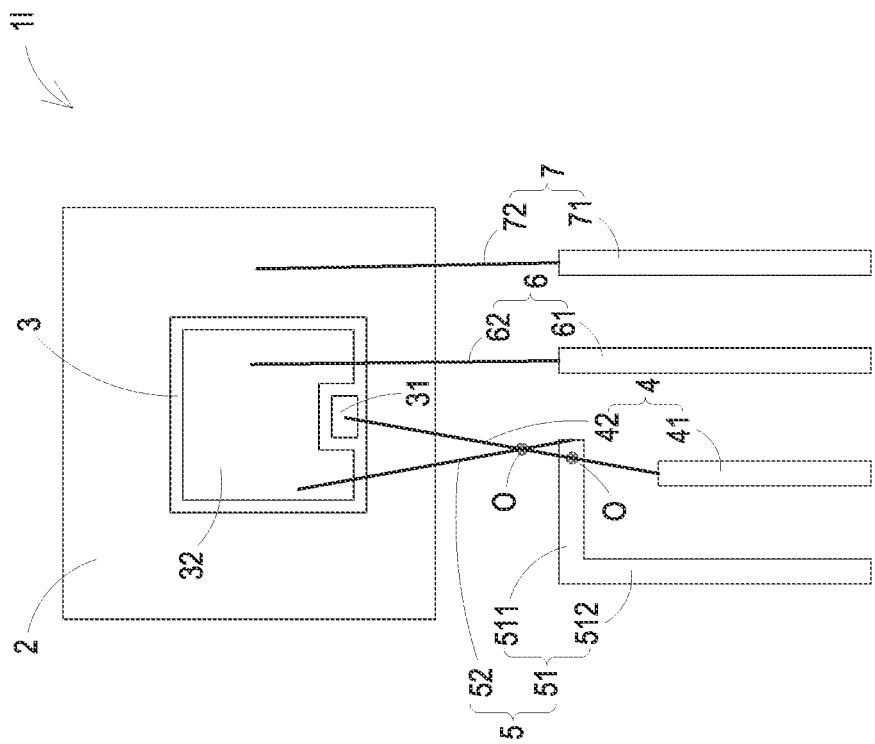
FIG. 18 is a schematic view illustrating the structure of a switching module according to a thirteenth embodiment of the present disclosure.

FIG. 18 is a schematic view illustrating the structure of a switching module according to a thirteenth embodiment of the present disclosure. The structures and functions of the components of the switching module 1*l* which are identical to those of the first embodiment are not redundantly described herein. Component parts and elements corresponding to those of the first embodiment are designated by identical numeral references. In comparison with the first embodiment, the second control pin 51 of the second control part 5 includes a third segment 511 and a fourth segment 512. The third segment 511 and the fourth segment 512 are perpendicular to each other. A first end of the third segment 511 and a first end of the fourth segment 512 are connected with each other. Preferably, the third segment 511 and the fourth segment 512 are integrally formed as a one-piece structure. A second end of the third segment 511 is connected with the second conductor 52. In addition, the third segment 511 is arranged between the first control pin 41 and the switching element 3. In an embodiment, the plane of the substrate 2 is a reference plane. In this embodiment, the projection area of the first conductor 42 of the first control part 4 on the reference plane intersects with the projection area of the second conductor 52 of the second control part 5 on the reference plane at an intersection O. Moreover, the projection area of the first conductor 42 of the first control part 4 on the reference plane intersects with the projection area of the third segment 511 of the second control pin 51 of the second control part 5 on the reference plane at another intersection O.

Figure 19:
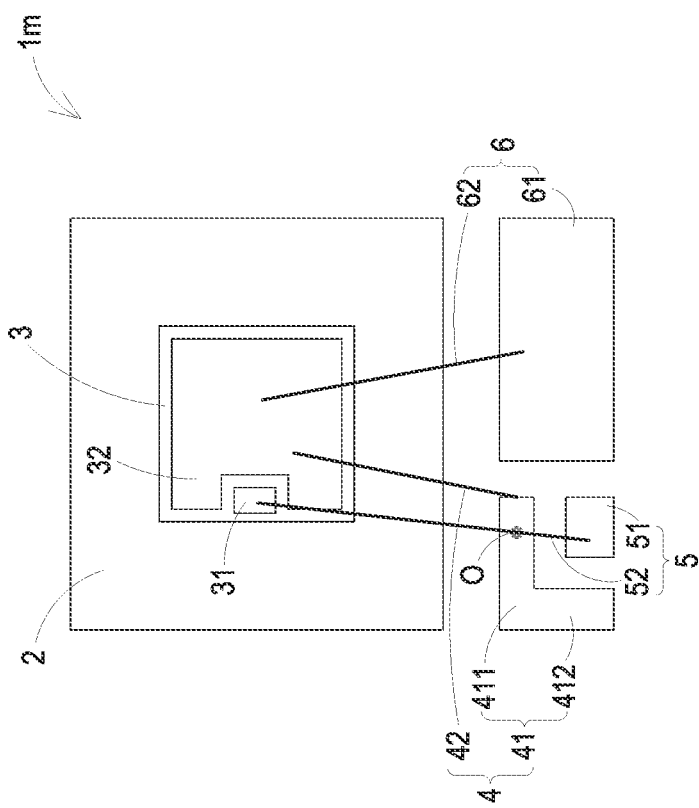
FIG. 19 is a schematic view illustrating the structure of a switching module according to a fourteenth embodiment of the present disclosure.

FIG. 19 is a schematic view illustrating the structure of a switching module according to a fourteenth embodiment of the present disclosure. The structures and functions of the components of the switching module 1*m* which are identical to those of the first embodiment are not redundantly described herein. Component parts and elements corresponding to those of the first embodiment are designated by identical numeral references. In comparison with the first embodiment, the second power pin of the second power part in the switching module 1*m* of this embodiment is formed by a portion of the substrate 2, or the second power pin of the second power part in the switching module 1*m* of this embodiment is disposed on the substrate 2 by a surface mount technology. Since the substrate 2 of the switching module 1*m* is directly connected with the second power terminal 33 of the switching element 3, the second power part of the switching module 1m is not additionally equipped with the fourth conductor to be connected with the second power terminal 33 of the switching element 3. Moreover, the first control pin 41 of the first control part 4 in the switching module 1m includes a first segment 411 and a second segment 412. A first end of the first segment 411 and a first end of the second segment 412 are connected with each other. An angle is formed between the first segment 411 and the second segment 412. For example, the first segment 411 and the second segment 412 are perpendicular to each other. A second end of the first segment 411 is connected with the first conductor 42.

In this embodiment, the first control terminal 31 of the switching element 3 is located beside a first side of the substrate 2, and the first control pin 41, the second control pin 51 and the first power pin 61 are located beside a second side of the substrate 2. In an embodiment, the plane of the substrate 2 is a reference plane. Moreover, the projection area of the first segment 411 of the first control pin 41 of the first control part 4 on the reference plane intersects with the projection area of the second conductor 52 of the second control part 5 on the reference plane at an intersection O.

In the embodiments of FIGS. 17, 18 and 19, the projection areas of the conductor intersect with the corresponding control pin on the reference plane. These concepts can be also applied to the embodiments of FIGS. 11A, 11B, 12A, 12B, 13A, 13B, 14, 15A and 15B.

From the above descriptions, the preset disclosure provides a switching module. In the switching module, an intersection is formed between the projection area of the first control part on the reference plane and the projection area of the second control part on the reference plane. The mutual inductance between the current of the power loop and the overall control loop in the switching module is reduced, and the self-inductance of the control loop in the switching module is reduced. Consequently, the safety performance of the switching module is enhanced.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A switching module, comprising:
    at least one substrate;
    at least one switching element disposed on the substrate, wherein each switching element comprises a first control terminal, a second control terminal, a first power terminal and a second power terminal;
    at least one first control part connected with the first control terminal of the corresponding switching element;
    at least one second control part connected with the second control terminal of the corresponding switching element, wherein a projection area of the first control part on a reference plane intersects with a projection area of the second control part on the reference plane at one or more first intersections;
    at least one first power part connected with the first power terminal of the corresponding switching element; and
    at least one second power part connected with the second power terminal of the corresponding switching element;

wherein the magnetic fluxes passing through an area defined by a projection area of the first control part and the second control part on one side surface is used to compensate the magnetic fluxes passing through an area defined by a projection area of the first control part and the second control part on the reference plane, so that the total magnetic fluxes passing through and area defined by the first control part and the second control part is reduced, wherein the side surface and the reference plane are cross with each other.

2. The switching module according to claim 1, wherein the first control part comprises a first control pin and a first conductor, the first conductor is connected between the first control pin and the first control terminal of the corresponding switching element, the second control part comprises a second control pin and a second conductor, and the second conductor is connected between the second control pin and the second control terminal of the corresponding switching element.

3. The switching module according to claim 2, wherein a projection area of the first conductor on the reference plane intersects with a projection area of the second conductor on the reference plane at the one or more first intersections.

4. The switching module according to claim 2, wherein a projection area of the first control pin on the reference plane intersects with a projection area of the second conductor on the reference plane at the one or more first intersections.

5. The switching module according to claim 2, wherein the first power part comprises a first power pin and a third conductor, and the third conductor is connected between the first power pin and the first power terminal of the corresponding switching element, wherein the second power part comprises a second power pin and a fourth conductor, and the fourth conductor is connected between the second power pin and the second power terminal of the corresponding switching element.

6. The switching module according to claim 5, wherein the first control pin, the second control pin, the first power pin and the second power pin are arranged sequentially.

7. The switching module according to claim 5, wherein the second control part and the first power part share a common part.

8. The switching module according to claim 2, wherein the first control pin comprises a first segment and a second segment, wherein a first end of the first segment and a first end of the second segment are connected with each other, an angle is formed between the first segment and the second segment, a second end of the first segment is connected with the first conductor.

9. The switching module according to claim 8, wherein the first segment and the second segment are integrally formed as a one-piece structure.

10. The switching module according to claim 2, wherein the at least one switching element comprises a plurality of switching elements, the at least one first control part comprises a plurality of first control parts, and the at least one second control part comprises a plurality of second control parts, wherein the first control pin of each first control part is connected with the first control terminal of the corresponding switching element through the corresponding first conductor, and the second control pin of each second control part is connected with the second control terminal of the corresponding switching element through the corresponding second conductor, wherein the projection area of the first control part of at least one switching element on the reference plane intersects with the projection area of the second control part of the corresponding switching element on the reference plane at the one or more first intersections.

11. The switching module according to claim 10, wherein the projection area of the first control part of each switching element on the reference plane intersects with the projection area of the second control part of the corresponding switching element on the reference plane at the one or more first intersections.

12. The switching module according to claim 10, wherein the at least one substrate comprises a plurality of substrates, and the plurality of switching elements are disposed on the corresponding substrates respectively.

13. The switching module according to claim 2, wherein the at least one switching element comprises a first switching element and a second switching element, wherein the first control terminal of the first switching element is connected with the first control terminal of the second switching element through a seventh conductor, the first control terminal of the first switching element is connected with the first control pin through the first conductor, the second control terminal of the first switching element is connected with the second control terminal of the second switching element through a sixth conductor, and the second control terminal of the first switching element is connected with the second control pin through the second conductor.

14. The switching module according to claim 13, wherein a projection area of the sixth conductor on the reference plane intersects with a projection area of the seventh conductor on the reference plane at one or more second intersections.

15. The switching module according to claim 13, wherein the second power terminal of the first switching element and the first power terminal of the second switching element are connected with each other, or wherein the first power terminal of the first switching element and the first power terminal of the second switching element are connected with each other, and the second power terminal of the first switching element and the second power terminal of the second switching element are connected with each other.

16. The switching module according to claim 1, wherein the switching element is an insulated gate bipolar transistor (IGBT) or a bipolar junction transistor (BJT), wherein the first control terminal is a gate terminal or a base of the switching element, the second control terminal and the first power terminal are collaboratively formed as an emitter of the switching element, and the second power terminal is a collector of the switching element.

17. The switching module according to claim 1, wherein the switching element is a metal-oxide-semiconductor field-effect transistor (MOSFET), a junction field effect transistor (JFET) or a gallium nitride high electron mobility transistor (GaN-HEMT), wherein the first control terminal is a gate terminal of the switching element, the second control terminal and the first power terminal are collaboratively formed as a source terminal of the switching element, and the second power terminal is a drain terminal of the switching element.

18. The switching module according to claim 1, wherein the first control part and the second control part are not coplanar, wherein a projection area of the first control part on the side surface is located between a projection area of the second control part on the side surface and a projection area of the first power part on the side surface, or the projection area of the first control part on the side surface is located between the projection area of the second control part on the side surface and a projection area of the second power part on the side surface.

19. The switching module according to claim 1, wherein the first control part and the second control part are not coplanar, wherein a projection area of the second control part on the side surface is located between a projection area of the first control part on the side surface and a projection area of the first power part on the side surface, or the projection area of the second control part on the side surface is located between the projection area of the first control part on the side surface and a projection area of the second power part on the side surface.

\* \* \* \* \*